United States Patent [19]

Suzuki

[11] Patent Number: 4,463,447
[45] Date of Patent: Jul. 31, 1984

[54] MAGNETIC BUBBLE GENERATOR
[75] Inventor: Ryo Suzuki, Kodaira, Japan
[73] Assignee: Hitachi, Ltd., Tokyo, Japan
[21] Appl. No.: 277,608
[22] Filed: Jun. 26, 1981
[30] Foreign Application Priority Data Jun. 27, 1980 [JP] Japan ................................. 55-86624

[51] Int. Cl.³ ........................................... G11C 19/08
[52] U.S. Cl. ................................................. 365/12
[58] Field of Search ................................. 365/11, 12

[56] References Cited

U.S. PATENT DOCUMENTS 4,086,661 4/1978 Matshashi ............................. 365/11
4,257,109 3/1981 Schwartz ............................. 365/11

FOREIGN PATENT DOCUMENTS

11731 1/1977 Japan ..................................... 365/11
69550 6/1978 Japan ..................................... 365/11

Primary Examiner—James W. Moffitt
Attorney, Agent, or Firm—Antonelli, Terry & Wands

[57] ABSTRACT

A nucleation type magnetic bubble generator according to this invention has a conductor loop which consists of a hairpin portion and wiring portions. Moreover, the relationship of $W \leq \frac{3}{4} P$ holds between the width W of each wiring portion and the period P of a propagation path. As a result, the generation of an extra magnetic bubble can be suppressed, so that a magnetic bubble generator of wide current margin can be provided.

12 Claims, 13 Drawing Figures

MAGNETIC BUBBLE GENERATOR

BACKGROUND OF THE INVENTION

This invention relates to a magnetic bubble memory device, and more particularly to improvements in a magnetic bubble generator in such memory device.

The magnetic bubble memory device is well known to those skilled in the art. One mode of operation of such storage device is called the "field access". The reason is that the movement of magnetic bubbles within a thin film of a magnetic bubble material is conducted in response to a magnetic field rotating within the plane of the thin film.

In a typical case, the thin film is an epitaxial film of garnet. The magnetic bubbles move within the thin film along a propagation path which is defined by the cyclic patterns of a soft magnetic material (high permeability), typically permalloy. In response to the magnetic field rotating within the plane of the thin film, the material generates magnetic poles, which give rise to a localized field gradient for moving the magnetic bubbles within the thin film.

Figure 1:
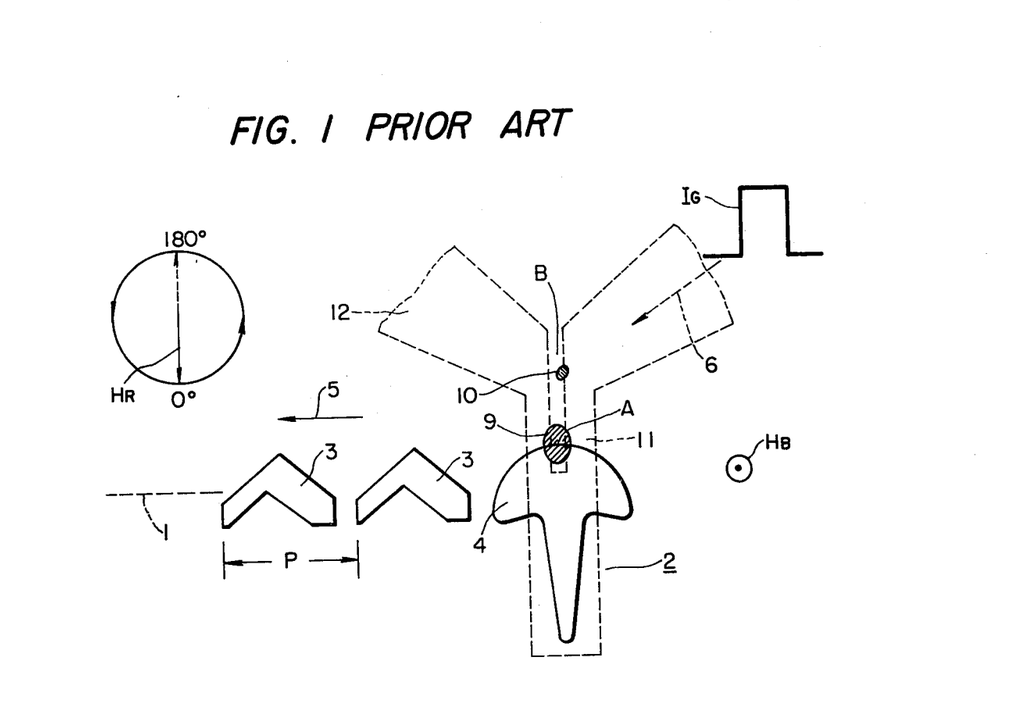
FIG. 1 is a diagram of the fundamental construction of a prior-art magnetic bubble generator.

The magnetic bubble memory device of this type usually has the "major/minor loop" or "major line/minor loop" organization. In either memory organization, the magnetic bubble generator is disposed in the major loop or the major line. The magnetic bubble generators are broadly classified into the seed bubble type and the nucleation type. Presently conventional among them is the magnetic bubble generator of the latter or the nucleation type. In this type, a hairpin-shaped conductor loop is disposed between the magnetic bubble propagation path and the thin film of the magnetic bubble material in a manner to be insulated therefrom, and a pulse current is caused to flow through the loop, whereby a magnetic bubble is generated in the part of the thin film corresponding to a stable point on the magnetic bubble propagation path. FIG. 1 shows the construction of a prior-art, nucleation type magnetic bubble generator. Referring to the figure, numeral 1 designates a propagation path, and numeral 2 a conductor loop. The propagation path 1 is exemplified as employing asymmetric chevron elements 3. Numeral 4 designates an element which has a shape suitable for generating a magnetic bubble 9 and which is called the "pickax element". The pickax element 4 is also one element which constitutes the propagation path 1 of the magnetic bubble 9. The magnetic bubble generator is constructed of the conductor loop 2 and the pickax element 4. Here, a rotating field $H_R$ is rotating counterclockwise as indicated in the figure. In response to this rotating field $H_R$, accordingly, the magnetic bubble 9 is propagated leftwards (in the direction of arrow 5) along the propagation path 1. For the sake of convenience, a vertically downward position shall be selected 0° as the reference of the direction of the rotating field $H_R$ as indicated in the figure. Further, for the sake of convenience, a bias field $H_B$ is supposed to be acting in a direction out of the paper as indicated in the figure. In this case, when the direction (phase) of the rotating field $H_R$ is 180°, the end face A of the pickax element 4 surrounded with the conductor loop 2 becomes the stable existence position of the magnetic bubble 9.

The generation of the magnetic bubble 9 is effected by causing a pulse current $I_G$ to flow into the conductor loop 2 in the direction of arrow 6 when the direction of the rotating field $H_R$ is near 180°. When the pulse current $I_G$ flows through the conductor loop 2, a magnetic field established in a region B surrounded with the conductor loop 2 is in a direction into the paper. That is, this magnetic field acts so as to weaken the bias field $H_B$ in the region B. Owing to the pulse current $I_G$, the magnetic bubble 9 is generated at the end face A of the pickax element 4. The magnetic bubble 9 thus generated is propagated from the element 4 to the element 3 or leftwards along the propagation path 1 in response to the rotation of the rotating field $H_R$. Depending on whether or not the pulse current $I_G$ is caused to flow into the conductor loop 2, the magnetic bubble 9 is existent or nonexistent in the element 3 constituting the propagation path 1. By bringing the "presence" and "absence" of the magnetic bubble 9 into correspondence with "1" and "0" of information denoted by the binary system, respectively, a train of information can be formed on the propagation path 1.

Such prior-art magnetic bubble generator has a problem as stated below.

The problem is that when the operation of generating the magnetic bubble 9 is repeated over a long time, a malfunction can occur. In the malfunction, an undesirable extra magnetic bubble 10 is generated in the region B shown in FIG. 1. The magnetic bubble 10 moves round the magnetic bubble generator, finally enters the propagation path 1, and forms a cause for disordering the train of information. In a graph of FIG. 2, the ordinate represents pulse current, the abscissa represents the surface temperature of the chip of a magnetic bubble memory, and the upper limit values (straight line 7) and lower limit values (straight line 8) of the amplitude of the pulse current $I_G$ allowable at respective temperatures as have been obtained are connected as the straight lines. The lower limit value of the amplitude of the pulse current $I_G$ is a current value which is required for generating a magnetic field sufficient to weaken magnetization induced by the bias field $H_B$ in the direction thereof and to turn it into the opposite direction. On the other hand, the upper limit value of the amplitude of the pulse current $I_G$ is not considered to exist specifically, but it is actually existent as stated above. More specifically, the upper limit value is determined by that amplitude of the pulse current $I_G$ at which the extra magnetic bubble 10 described above is generated in a fixed proportion. The straight line 7 in FIG. 2 indicates the upper limit values which correspond to the amplitudes of the pulse currents $I_G$ in the case where one extra magnetic bubble 10 is generated in the region B when $10^8$ magnetic bubbles 9 have been generated by the generator.

Figure 2:
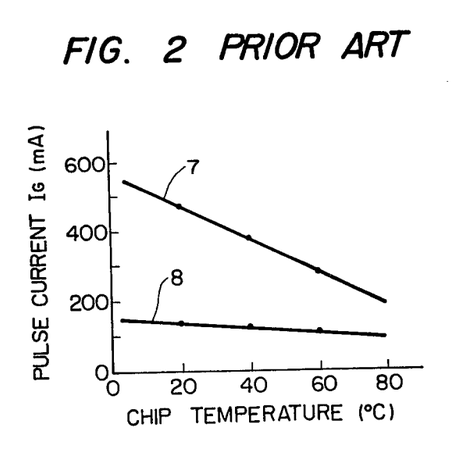
FIG. 2 is a diagram of the characteristic of the magnetic bubble generator shown in FIG. 1, FIGS. 3A to 3C are model diagrams for explaining the basic principle of this invention.

As apparent from the tendency of the straight line 8 in FIG. 2, the lower limit value is not problematic because it lowers only slightly even when the temperature of the chip has risen. In contrast, the upper limit value lowers greatly with the rise of the temperature of the chip as apparent from the tendency of the straight line 7. This signifies that when the temperature of the chip has become high, the width between the upper and lower limits of the allowable amplitude of the pulse current $I_G$, i.e., the current margin becomes very small. Therefore, any countermeasure has been eagerly desired.

SUMMARY OF THE INVENTION

It is accordingly an object of this invention to provide a magnetic bubble generator which has a great pulse current margin even when the temperature of a chip has changed.

In order to accomplish the object, according to this invention, a magnetic bubble generator is characterized in that, in a conductor loop consisting of a hairpin portion which locally establishes a reversed magnetic field for generating a magnetic bubble and wiring portions which are respectively connected to end parts of the hairpin portion on both the sides thereof in order to supply a pulse current to the hairpin portion, the width of each wiring portion is specified so as not to exceed $\frac{3}{4}$ of the period of a propagation path.

The magnetic bubble generator is further characterized in that, in order to avoid the increase of a resistance value attributed to the specification of the width of the wiring portion, the shortest possible length L of the wiring portion over which the condition of the width must be held is specified by the following equation:

$$L = V_s \times T_w$$

where
- L: length (mm) measured on the center line of the wiring portion from the point of intersection between the extension of the outer edge of the hairpin portion and the center line of the wiring portion,
- $V_s$: saturation wall velocity (mm/sec) of a thin film, and
- $T_w$: pulse width (ns) of the pulse current (90% value of amplitude of leading edge—90% value of amplitude of trailing edge).

Owing to such characterizing construction of this invention, an extra magnetic bubble becomes difficult to appear even when the amplitude of the pulse current is large. It is therefore permitted to cause a great pulse current to flow even when the temperature of a chip has risen. As a result, even when the chip temperature changes, a wide current margin can be ensured at all times.

DESCRIPTION OF THE PREFERRED EMBODIMENTS

Figure 3A:
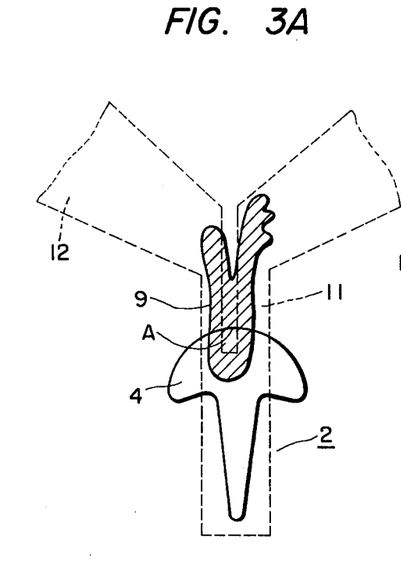
Figure 3B:
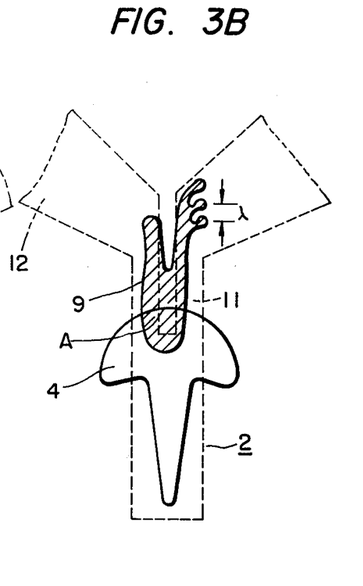
Figure 3C:
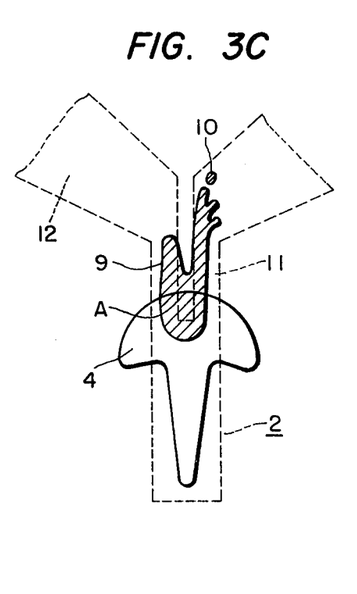

First, the basic concept of this invention will be described. This invention has been accomplished on the basis of an experimental fact as stated below. When, in the magnetic bubble generator shown in FIG. 1, the situation of the generation of the magnetic bubbles 9 in the case where the amplitude of the pulse current $I_G$ to be fed into the conductor loop 2 exceeded the upper limit value (straight line 7) shown in FIG. 2 was observed in detail, the following characteristic phenomenon was found out. The magnetic bubble 9 generated at the end face A of the pickax element 4 in FIG. 1 grows and enlarges with the lapse of the conduction time of the pulse current $I_G$. When an end part of the magnetic bubble 9 has come from a hairpin portion 11 of the conductor loop 2 up to a wiring portion 12 thereof, it spreads its width. At this time, the shape of the magnetic domain of the end part of the magnetic bubble 9 does not present a cylindrical domain shape any longer and becomes a characterizing wavy domain shape as shown in FIG. 3A. When the conduction time of the pulse current $I_G$ has ended, the wavy magnetic domain of the end part of the magnetic bubble 9 contracts towards the stable existence position A of the element 4. At that time, the fore end of the wavy magnetic domain becomes constricted as shown in FIG. 3B. At last, the fore end of the wavy magnetic domain severs as shown in FIG. 3C. As a result, the magnetic bubble 9 which ought to appear and the extra magnetic bubble 10 which ought not to appear are generated as illustrated in FIG. 1. As stated before, the extra magnetic bubble 10 does not appear whenever the magnetic bubble 9 is generated, and the proportion of the generation of the bubble 10 is greatly affected by the chip temperature and the amplitude of the pulse current $I_G$ on the particular occasion.

It has been known that the aforecited wavy magnetic domain appears when a rectilinear magnetic wall moves orthogonally to the plane of the wall (T. M. Morris and A. P. Malozemoff, AIP Conference Proceedings No. 18, Magnetism and Magnetic Materials—1973, pp. 242–246). Letting λ denote the wavelength of the wavy magnetic domain (refer to FIG. 3B), the following approximation holds:

$$\lambda/h \approx 0.8 + 22 \, l/h \qquad (1)$$

Here, h denotes the thickness of the magnetic bubble garnet film, and l the characteristic length thereof.

As understood from Equation (1), if the length of the magnetic wall orthogonal to the growing direction of the magnetic bubble 9 is suppressed to be smaller than the wavelength λ in the process of the generation of the magnetic bubble 9, the wavy magnetic domain will not appear. As a result, the extra magnetic bubble 10 arising due to the severance of the wavy magnetic domain will not appear, either.

In the ordinary magnetic-bubble garnet film, letting d denote the diameter of the magnetic bubble to be used, the following holds:

$$d \approx 10l$$

$$d \approx h$$

Letting P denote the bit period of the propagation path 1 of the magnetic bubble 9 shown in FIG. 1, the following relation is usually held:

$$P = 4d$$

Then, Equation (1) can be reduced as follows:

$$\lambda \approx \tfrac{3}{4} P \qquad (2)$$

It is understood from Equation (2) that in the magnetic bubble generator of the magnetic bubble memory device in which the bit period of the propagation path 1 is P, the width of the wiring portion 12 of the conductor loop 2 may be maintained at or below ¾ of the bit period P in order to prevent the extra magnetic bubble 10 from appearing even when the amplitude of the pulse current $I_G$ becomes large.

The magnetic bubble 9 does not grow infinitely along the conductor loop 2, but it grows only for the period of time during which the pulse current $I_G$ is flowing. At the generation of the magnetic bubble 9, the magnetic wall thereof propagates at the saturation wall velocity $V_s$ of the thin film. Accordingly, letting $T_w$ denote the pulse width (90%—90%) of the pulse current $I_G$ which is caused to flow through the conductor loop 2 in order to generate the magnetic bubble 9, the propagation length L of the magnetic wall of the magnetic bubble 9 becomes:

$$L = V_s \cdot T_w \qquad (3)$$

It is accordingly understood from Equation (3) that the length over which the width of the wiring portion 12 of the conductor loop 2 is made below ¾ of the bit period P may be at most the propagation length L of the magnetic wall.

Usually, the saturation wall velocity $V_s$ is approximately 20 m/s and the pulse width $T_w$ of the pulse current $I_G$ is not greater than 300 ns. The propagation length L therefore becomes approximately 6 μm or less.

Hereunder, for a better understanding of this invention, a few examples of concrete conductor loops will be mentioned and described.

Figure 4:
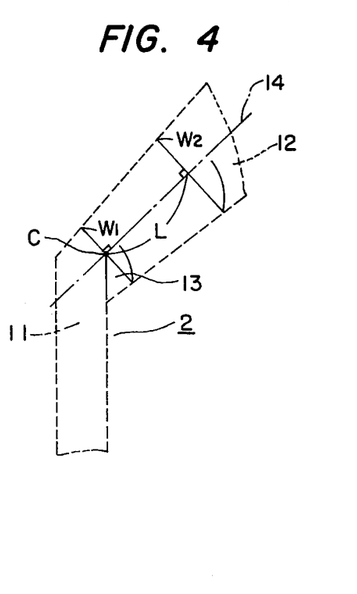
FIG. 4 is a diagram for explaining the dimensions and shape of a conductor loop according to this invention.

First of all, the definitions of the length (propagation length) L and width W of the wiring portion 12 will be explained with reference to the drawing. FIG. 4 shows a part of the conductor loop 2 in order to lay down the definitions. As stated before, the conductor loop 2 is constructed of the hairpin portion 11 and the wiring portions 12. At this time, the length (propagation length) L of the wiring portion 12 is defined as a length which is measured along the center line 14 of the wiring portion 12 from the point of intersection C between the extension 13 of the outer edge of the hairpin portion 11 and the center line 14 of the wiring portion 12. The width W of the wiring portion 12 is defined as a width which is measured at right angles to the center line 14 from the outside edge of the wiring portion 12 to the opening between wiring portions. At this time, the width of the wiring portion 12 at the intersection point C is denoted by $W_1$, and that at the length L is denoted by $W_2$.

EMBODIMENT 1

Figure 5A:
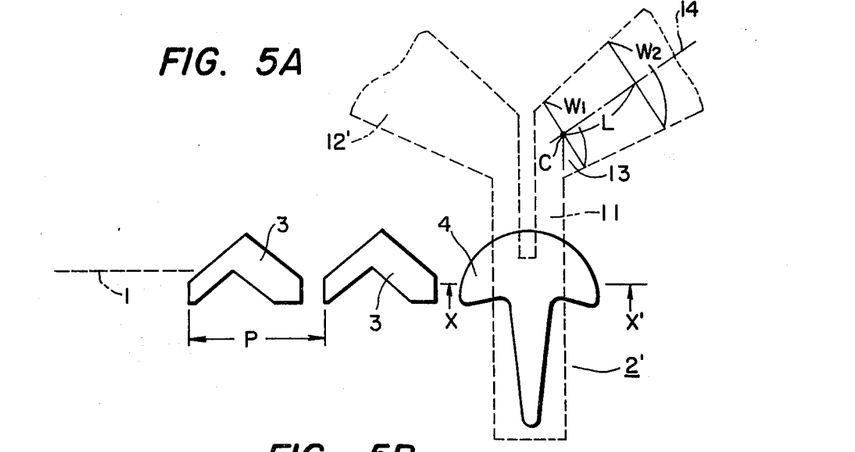
FIGS. 5A, 5B and 5C are a plan view, a sectional view and a characteristic diagram of a magnetic bubble generator according to this invention, respectively.
Figure 5B:
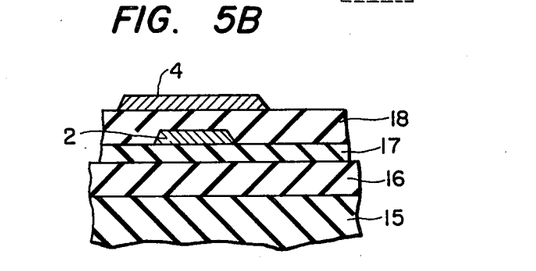

FIG. 5A shows the fundamental construction of the magnetic bubble generator according to this invention, while FIG. 5B shows the construction of a section X—X' of the magnetic bubble generator according to this invention shown in FIG. 5A.

In FIGS. 5A and 5B, numeral 16 designates a thin film of $(YSmLuCa)_3(FeGe)_5O_{12}$ which is deposited on a nonmagnetic GGG (gadoliniumgallium garnet) substrate 15 by the liquid phase epitaxial growth. Symbol 2' indicates a conductor loop, which is disposed on the thin film 16 through an insulating layer 17. Shown at numeral 4 is a pickax element which constitutes the magnetic bubble generator and a propagation path 1, and which is disposed on the conductor loop 2' through an insulating layer 18. The shape of the conductor loop 2' according to the present embodiment is the same as that of the conductor loop 2 shown in FIG. 1, and the conductor loop 2' is characterized in that the width of its wiring portion 12' increases gradually. The propagation path 1 is constructed of asymmetric chevron elements 3, and its period P is 8 μm. The diameter of a magnetic bubble to be used is 2 μm, and the saturation wall velocity $V_s$ of a magnetic bubble material is 25 m/s. The 90%—90% pulse width $T_w$ of a pulse current which is caused to flow through the conductor loop 2' is 100 ns. The width $W_1$ of the wiring portion 12' is 4 μm, the length L is 2.5 μm, and the width $W_2$ at that time is 5 μm. The width of the hairpin portion 11 is 3 μm. The aforecited dimensions of the wiring portion 12' lie within the scope of this invention because the width W ought not exceed 6 μm and the length L ought to be at least 2.5 μm.

Figure 5C:
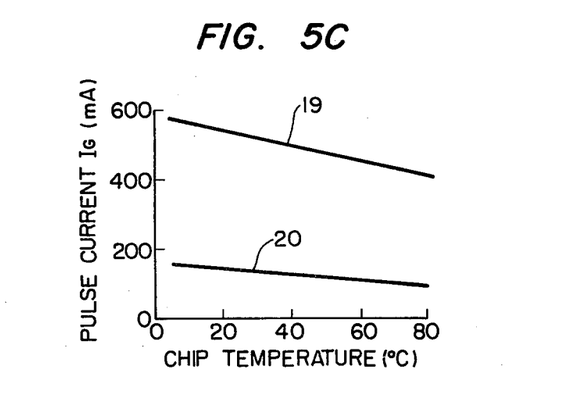

FIG. 5C is a graph showing the effect of the present embodiment. The ordinate represents pulse current, the abscissa represents the temperature of a chip, and the upper and lower limit values of the amplitude of the pulse current $I_G$ allowable at various values of the chip temperature are illustrated. The definitions of the upper and lower limit values are as stated previously. As apparent from FIG. 5C, the upper limit values (straight line 19) of the pulse current $I_G$ decrease in a small proportion even when the chip temperature has risen, and by way of example, the amplitude of the pulse current $I_G$ allowable at a chip temperature of 60° C. is as great as 450 mA. This signifies that the current margin of the magnetic bubble generator according to the present embodiment is very wide. The lower limit values (straight line 20) of the pulse current are scarcely different from those in the prior art.

In contrast, the prior-art magnetic bubble generator (refer to FIG. 1) which differs only in the dimensions of the wiring portion 12' of the conductor loop 2' (the width $W_1$ is 7 μm, the length L is 6 μm, and the width $W_2$ is 12 μm) exhibits the characteristic of FIG. 2 as has already been stated. By way of example, the amplitude of the pulse current $I_G$ allowable at the chip temperature of 60° C. is 280 mA, and the current margin becomes very narrow.

EMBODIMENT 2

Figure 6A:
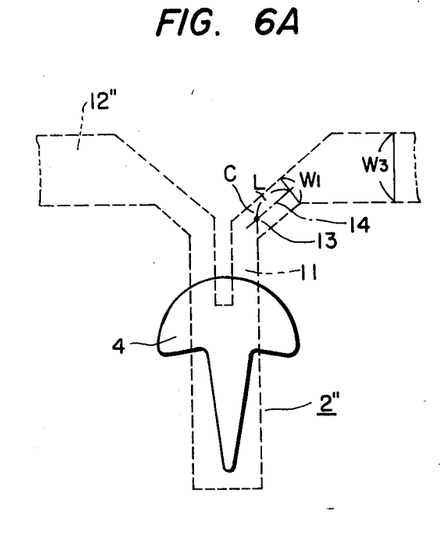
FIGS. 6A and 6B are a plan view and a characteristic diagram of another embodiment according to this invention, respectively.

FIG. 6A shows the fundamental construction of another embodiment of this invention. The point of difference from Embodiment 1 shown in FIGS. 5A and 5B consists in the shape of a conductor loop 2''. More specifically, the conductor loop 2'' according to the present embodiment consists of a hairpin portion 11 and wiring portions 12'', and it is characterized in the shape of the wiring portion 12''. The wiring portion 12'' extends obliquely upwards from the hairpin portion 11 at a fixed width $W_1$ and over a length L, and thereafter becomes a fixed width $W_3$.

Figure 6B:
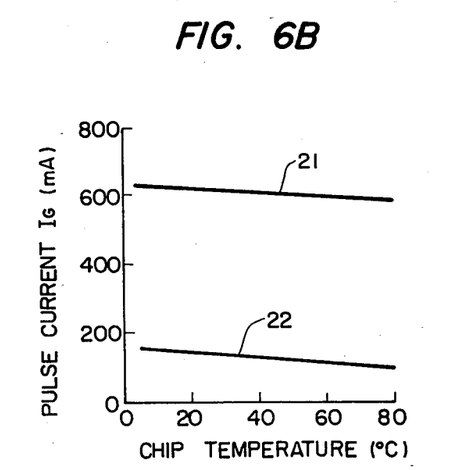

Here, the width $W_1$ of the wiring portion 12'' is 3 μm, and the length L is also 3 μm. The width $W_3$ is 15 μm. The other conditions are quite the same as in Embodiment 1. FIG. 6B illustrates the upper and lower limit values (straight lines 21 and 22) of the amplitude of a pulse current $I_G$ versus the temperature of a chip in such a magnetic bubble generator. The variation of the lower limit values indicated by the straight line 22 is scarcely different from that in the prior-art magnetic bubble generator. However, the upper limit values indicated by the straight line 21 decrease slightly versus the temperature rise of the chip, and the current margin of the magnetic bubble generator of the embodiment is very wide. For example, the amplitude of the pulse current $I_G$ allowable at a chip temperature of 60° C. is about 600 mA.

In addition, the characteristic of a magnetic bubble generator in the case where the pulse width $T_w$ of 90%—90% of the pulse current $I_G$ to flow through the conductor loop 2" is made 300 ns and where the length L of the wiring portion 12" is made 7.5 μm is almost the same as in FIG. 6B.

EMBODIMENT 3

Figure 7A:
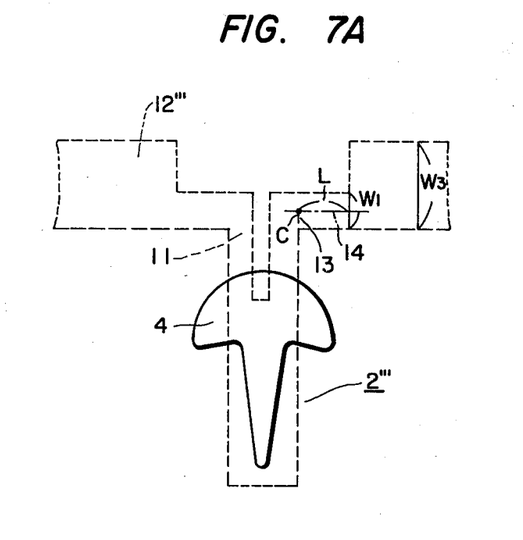
FIGS. 7A and 7B are a plan view and a characteristic diagram of still another embodiment according to this invention, respectively.

FIG. 7A shows the fundamental construction of still another embodiment of this invention. The point of difference from Embodiment 2 shown in FIG. 6A consists in the shape of a conductor loop 2'''. More specifically, the conductor loop 2''' according to the present embodiment is made up of a hairpin portion 11 and wiring portions 12''', and it is characterized in the shape of the wiring portion 12'''. The wiring portion 12''' extends from the hairpin portion 11 orthogonally thereto at a fixed width W, and over a length L, and thereafter becomes a fixed width $W_3$. It is the feature of the present embodiment that the wiring portion 12''' extends from the hairpin portion 11 orthogonally thereto.

Here, the width $W_1$ of the wiring portion 12''' is 5 μm, and the length L is 7.5 μm. The width $W_3$ is 20 μm. In the present embodiment, the pulse width $T_w$ of a pulse current $I_G$ which is caused to flow through the conductor loop 2''' is made 300 ns. The other conditions are quite the same as in Embodiment 1.

Figure 7B:
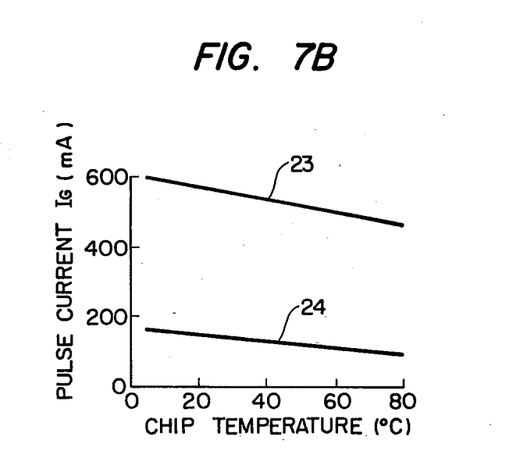

FIG. 7B illustrates the upper and lower limit values (straight lines 23 and 24) of the amplitude of the pulse current $I_G$ versus the temperature of a chip in such a magnetic bubble generator. The variation of the lower limit values indicated by the straight line 24 is scarcely different from that in the prior-art magnetic bubble generator. In contrast, the upper limit values indicated by the straight line 23 vary in a manner to decrease slightly versus the temperature rise of the chip, and the current margin of the magnetic bubble generator of the embodiment is considerably wide. For example, the amplitude of the pulse current $I_G$ allowable at a chip temperature of 60° C. is about 500 mA.

As set forth above, according to the magnetic bubble generator of this invention, an extra magnetic bubble becomes difficult to appear. Therefore, even when the temperature of a chip has risen, a great pulse current $I_G$ is permitted to flow. Thus, the magnetic bubble generator of wide current margin can be provided.

Although, in the foregoing embodiments, asymmetric chevron elements have been referred to as elements which constitute the propagation path of magnetic bubbles, it is a matter of course that other elements may well be employed.

I claim:

1. A magnetic bubble generator comprising a layer of a magnetic material in which a magnetic bubble can move in response to a rotating field; a propagation path which is constructed of elements of a soft magnetic material of high permeability the elements being disposed on the magnetic material layer through an insulating layer at a fixed period; and a conductor loop which consists of a hairpin portion and wiring portions and which is disposed between said magnetic material layer and said propagation path in a manner to be insulated therefrom in order to generate said magnetic bubble within a part of said magnetic material layer corresponding to said propagation path by causing a pulse current to flow; a width of said each wiring portion being specified so as not to exceed ⅜ of said period of said propagation path under a condition that a length measured on a center line of said wiring portion from a point of intersection between an extension of an outer edge of said hairpin portion and said center line of said wiring portion is at least equal to a propagation length determined from a product between a saturation wall velocity of said magnetic material of said layer and a pulse width of said pulse current.

2. A magnetic bubble generator according to claim 1, wherein said each wiring portion has its width gradually increased as it separates obliquely upwards from an end part of said hairpin portion.

3. A magnetic bubble generator according to claim 1, wherein said each wiring portion extends obliquely upwards from an end part of said hairpin portion with its width fixed.

4. A magnetic bubble generator according to claim 1, wherein said each wiring portion extends from an end part of said hairpin portion orthogonally thereto with its width fixed.

5. A magnetic bubble generator according to claim 1, wherein said elements of said propagation path are a pickax element and a plurality of asymmetric chevron elements.

6. A magnetic bubble generator comprising a layer of a magnetic material in which a magnetic bubble can move in response to a rotating field; a propagation path which is constructed of elements of a soft magnetic material of high permeability in order to specify the movement of the magnetic bubble, the elements being disposed on the magnetic material layer through an insulating layer at a fixed period; means for enabling generation of a desired magnetic bubble within a part of the magnetic material layer corresponding to the propagation path by causing a pulse current to flow, the magnetic bubble generation means including a conductor loop which consists of a hairpin portion and wiring portions and which is disposed between the magnetic material layer and the propagation path so as to be insulated therefrom, the magnetic bubble generation means including means for suppressing the generation of an extra magnetic bubble at the time of generation of a desired magnetic bubble, the means for suppressing the generation of an extra magnetic bubble enabling the maintaining of a large difference between a lower and upper limit of the values of amplitude of the pulse current over a large temperature range independent of the temperature of the magnetic bubble generator.

7. A magnetic bubble generator according to claim 6, wherein the means for suppressing the generation of an extra magnetic bubble suppression enables a large difference between the upper and lower limits of the values of the amplitude of the pulse current at a temperature of 60° C.

8. A magnetic bubble generator according to claim 6, wherein the means for suppressing the generation of an extra magnetic bubble include providing each wiring portion with a width which is no greater than ⅜ of the period of the propagation path.

9. A magnetic bubble generator according to claim 8, wherein said each wiring portion has its width gradually increased as it separates obliquely upwards from an end part of said hairpin portion.

10. A magnetic bubble generator according to claim 8, wherein said each wiring portion extends obliquely upwards from an end part of said hairpin portion with its width fixed.

11. A magnetic bubble generator according to claim 8, wherein said each wiring portion extends from an end part of said hairpin portion orthogonally thereto with its width fixed.

12. A magnetic bubble generator according to claim 8, wherein said elements of said propagation path are a pickax element and a plurality of asymmetric chevron elements.

* * * * *